(12) United States Patent
Ganfield et al.

(10) Patent No.: US 7,287,103 B2
(45) Date of Patent: Oct. 23, 2007

(54) METHOD AND APPARATUS FOR GENERATING A MASK VALUE AND COMMAND FOR EXTREME DATA RATE MEMORIES UTILIZING ERROR CORRECTION CODES

(75) Inventors: Paul Allen Ganfield, Rochester, MN (US); Kent Harold Haselhorst, Byron, MN (US); Charles Ray Johns, Austin, TX (US); Peichun Peter Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 11/130,911

(22) Filed: May 17, 2005

(65) Prior Publication Data

US 2006/0265546 A1 Nov. 23, 2006

(51) Int. Cl.
*G06F 3/00* (2006.01)
*G06F 12/00* (2006.01)
(52) U.S. Cl. .......................... 710/49; 365/120; 711/105
(58) Field of Classification Search .................. 710/30, 710/49, 68; 714/758; 711/105, 170; 365/120
See application file for complete search history.

(56) References Cited

U.S. PATENT DOCUMENTS

| | | | | |
|---|---|---|---|---|
| 5,896,545 A | * | 4/1999 | Barth et al. .................... | 710/4 |
| 6,151,239 A | * | 11/2000 | Batra .......................... | 365/120 |
| 6,697,276 B1 | * | 2/2004 | Pereira et al. ................. | 365/49 |
| 6,826,663 B2 | * | 11/2004 | Perego et al. ................ | 711/156 |
| 2003/0156465 A1 | | 8/2003 | LaBerge | |
| 2003/0204674 A1 | | 10/2003 | Ryan et al. | |
| 2004/0162934 A1 | | 8/2004 | LaBerge | |
| 2005/0015558 A1 | | 1/2005 | Evans et al. | |
| 2005/0083758 A1 | | 4/2005 | Ryan et al. | |
| 2006/0107003 A1 | * | 5/2006 | Barnum et al. ............. | 711/155 |
| 2006/0123187 A1 | * | 6/2006 | Bellows et al. ............. | 711/104 |
| 2006/0200723 A1 | * | 9/2006 | Carnevale et al. .......... | 714/758 |
| 2007/0043920 A1 | * | 2/2007 | Bellows et al. ............. | 711/167 |

\* cited by examiner

*Primary Examiner*—Hong Kim
(74) *Attorney, Agent, or Firm*—Stephen J. Walder, Jr.; Diana R. Gerhardt

(57) ABSTRACT

A method, an apparatus, and a computer program product are provided for the handling of write mask operations in an XDR™ DRAM memory system. This invention eliminates the need for a two-port array because the mask generation is done as the data is received. Less logic is needed for the mask calculation because only 144 of the 256 possible byte values are decoded. The mask value is generated and stored in a mask array. Independently, the write data is stored in a write buffer. The mask value is utilized to generate a write mask command. Once the write mask command is issued, the write data and the mask value are transmitted to a multiplexer. The multiplexer masks the write data using the mask value, so that the masked data can be stored in the XDR DRAMS.

20 Claims, 3 Drawing Sheets

METHOD AND APPARATUS FOR GENERATING A MASK VALUE AND COMMAND FOR EXTREME DATA RATE MEMORIES UTILIZING ERROR CORRECTION CODES

FIELD OF THE INVENTION

The present invention relates generally to a method for handling write mask operations, and more particularly, a method to handle write mask operations in an XDR memory system.

DESCRIPTION OF THE RELATED ART

An Extreme Data Rate (XDR™) memory system includes three primary semiconductor components: a memory controller, at least one XDR IO Cell (XIO), and XDR DRAMs, available from Rambus, Inc., 4440 El Camino Real, Los Altos, Calif. 94022. With XDR DRAMs, the data transfer rate to and from memory has been dramatically increased.

Write operations in an XDR memory system store a block of data in the XDR DRAMs. Occasionally, it is necessary to store less data than one block. However, an XDR write operation only supports transferring a full block of data to the XDR DRAMs. For a write smaller than a block, the memory controller uses a write mask operation to store the data. In a conventional DRAM memory system, the system uses a single mask bit to mask a byte or the memory controller simply does not write to the DRAM. However, in an XDR memory system, a byte mask value accompanies the write mask operation, so that a full block of data is always transferred to the DRAM. When the mask byte value appears in the block, the XDR DRAM does not write the corresponding memory location.

Write mask operations are accomplished by the memory controller in conjunction with the XIO. The memory controller issues the necessary commands to the XIO, including read and write commands. There are two conventional procedures for write mask operations in XDR memory systems. One procedure necessitates a search through the write data to determine a mask value utilizing a two-port data buffer. To do so, an on-chip buffer holding the write data has 2 ports, so that two locations in the write buffer can be read at the same time. One port reads the write data and calculates the mask value, and the other port sends the write data on the data bus. The two ports are necessary because the data for a write operation needs to be read twice; once for mask calculation and once to send the data to the DRAM with the mask value included. A two-port array takes up much more space than a single port array. The ability to accomplish write mask operations with a single port array would provide a significant improvement over conventional methods.

Another conventional procedure involves a speculative mask generation. With this procedure the system speculates a mask value and checks this mask value during the data transfer. If the speculative mask value was in the data packet then the system issues a second write with a different mask value. This procedure can lead to two consecutive write operations, which causes an unnecessary delay. It is clear that a modified method for handling write mask operations in an XDR memory system would improve system performance.

SUMMARY

The present invention provides a method, apparatus, and computer program product for handling write mask operations in an XDR memory system. The present modified write mask operation improves the delay involved with these operations and decreases the amount of area on the chip. In an illustrative embodiment, a block of data transferred between the memory controller and the XDR DRAM is called a cacheline or data packet and is 128 bytes. The memory system utilizes a write mask operation when it is necessary to write less data than a cacheline to the XDR DRAMs. For this type of operation the system must mask the bytes of data that are not to be stored. To save space on the chip, this modified method accomplishes the mask generation for a write mask operation as the data is received, which eliminates the need for a two-port array.

In this invention, the memory controller controls the transmission of the data packet to a write buffer and an error correction code (ECC) generation module, simultaneously. The write buffer stores the data packet until the memory controller issues a mask write command. The ECC generation module generates an ECC value and adds this value to the data packet. The ECC generation module transmits the data packet to the mask generation module for performing a mask calculation. Less logic is needed for the mask calculation because the mask calculation module only decodes 144 of the 256 possible byte values. The mask array stores this mask value. A command generation module creates a write mask command incorporating the mask value. When the memory controller issues the write mask command, the write buffer transmits the stored data packet to a separate ECC generation module where it adds the ECC value to the data packet. The ECC generation module and mask array input the write data packet and the mask value, respectively, to a set of byte wide multiplexers. The memory controller sends a mask write command to the DRAMs and control signals direct the multiplexers to mask the bytes in the data packet that are equivalent to the mask value. Then, the XDR DRAMs store the masked data packet.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

Figure 1:
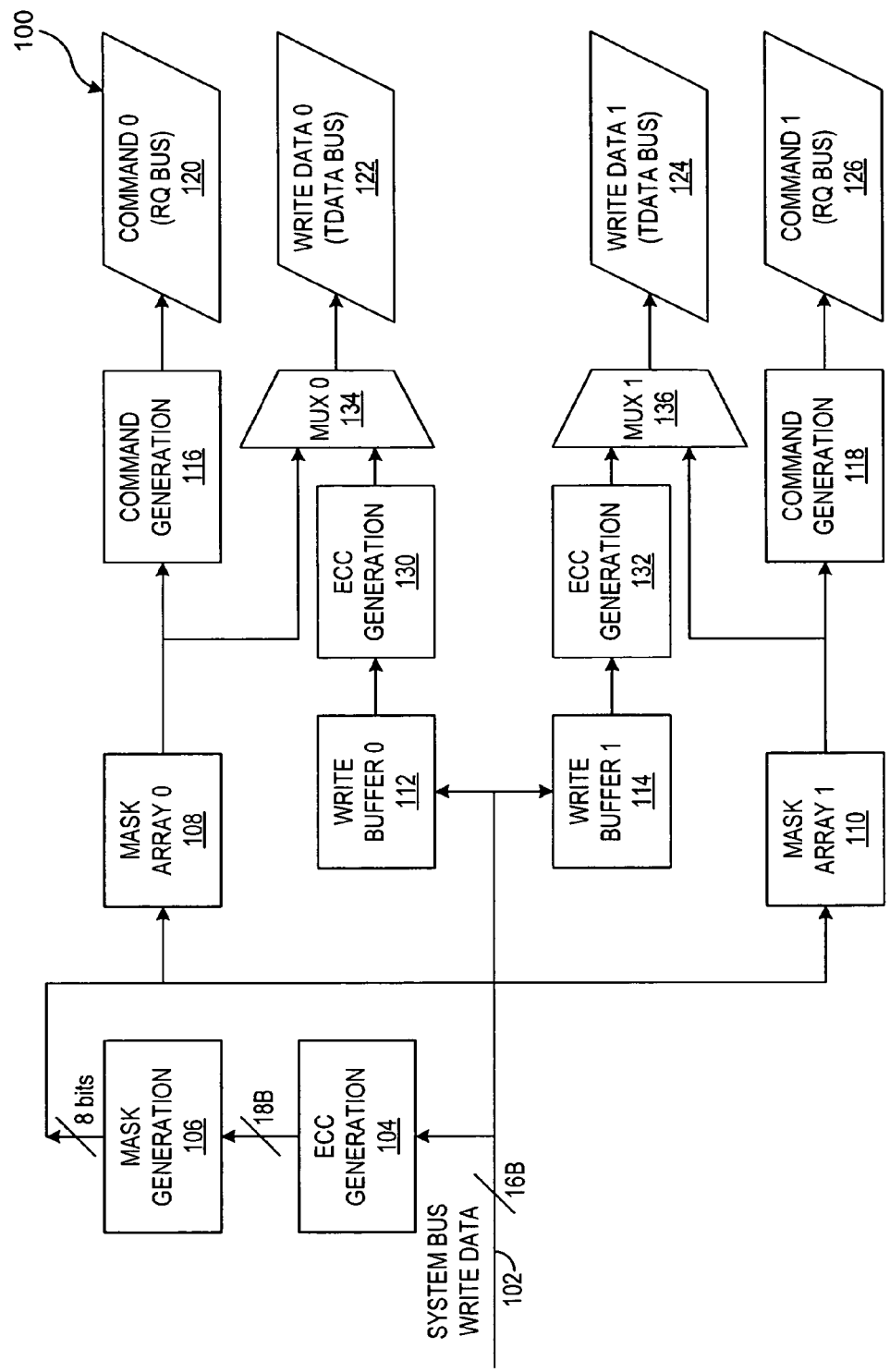
FIG. 1 is a block diagram illustrating an apparatus that accomplishes write mask operations in an XDR™ memory system.

Referring to FIG. 1 of the drawings, reference numeral 100 generally designates a block diagram illustrating an apparatus that accomplishes write mask operations in an XDR memory system. In this embodiment an XDR memory system contains two memory controller halves (not shown), two XIOs (not shown), and multiple XDR DRAMs (not shown). Each half of the memory controller works in conjunction with a specific XIO, and together these components control the data transmission to and from the XDR DRAMs. The XDR system utilizes the system bus 102 to transmit data. In this example, each write data packet (cacheline) contains 128 bytes. The data for a cacheline takes 8 beats (16 bytes per beat) on the system bus 102 per transmission. The memory controller controls the transmission of the write data packet to write buffer 0 112 or write buffer 1 114. Write buffer 0 112 corresponds to a specific XIO and write buffer 1 114 corresponds to the other XIO. The write buffers 112 or 114 store the write data packet until a command from the memory controller initiates the write operation.

The memory controller also controls the transmission of the write data packet to an error correcting code (ECC) generation module 104. In response, module 104 generates the ECC value that will be added to the write data packet to ensure that the mask generation module 106 does not generate a byte value matching either the write data or the ECC byte value. Specifically, the ECC generation module 104 adds two bytes or 16 bits of error correction code to the write data packet per cycle (8 cycles for a cacheline). ECC generation is commonly known in the related art. After ECC generation, 18 bytes of data is transmitted to mask generation module 106 per cycle. For a cacheline there are 144 bytes (128 data, 16 ECC).

Figure 2:
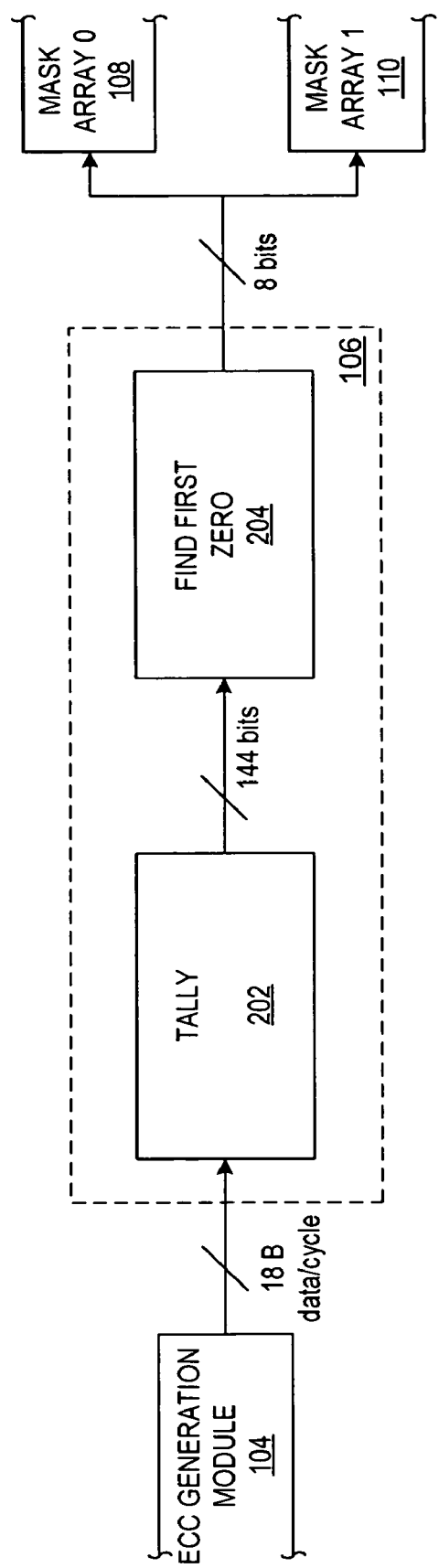
FIG. 2 is a block diagram illustrating an apparatus that accomplishes the mask value generation in the write mask operation.

The mask generation module 106 produces a 1 byte or 8 bit mask value that is associated with the write data packet (described in FIG. 2 in more detail). However, the mask value cannot match any of the write data byte values or the ECC byte values (144 bytes). The mask value serves as a "filler" to mask bytes of data in a block that are not to be stored. The mask generation module 106 transmits the 8 bit mask value to mask array 0 108 or mask array 1 110. Mask array 108 or 110 stores the mask value until the memory controller initiates the generation of a write mask command. Once again mask array 0 108 corresponds to a specific XIO and mask array 1 110 corresponds to the other XIO. Accordingly, mask array 0 108 and write buffer 0 112 provide write mask data through the same XIO, and mask array 1 110 and write buffer 1 114 provide write mask data through the other XIO.

The memory controller controls the transmission of the mask value from mask array 0 108 to the command generation module 116, which in turn uses it to generate a write mask command 0 120 (which is transmitted on an RQ bus to the XDR DRAMs). This command 0 120 tells the XDR DRAM (not shown) not to store any byte values that match the mask value. The write buffer 0 112 connects to an ECC generation module 130, which generates the ECC values and adds them to the write data packet. This ECC generation module 130 feeds MUX 0 134, which also has an input of the mask array 0 108. The memory controller sets MUX 0 134 based which portion of the cacheline should be written (the rest is masked by muxing in the mask value into each masked data byte). The output of MUX 0 134 is the write data 0 122, which is transmitted on the data bus to the XDR DRAMs. From there, the memory controller controls the transmission of the write data 0 122 by the XIO to store the masked data in the correct XDR DRAM. On the data bus, a beat of 8 bytes of data and 1 byte of ECC are written to the correct DRAM per cycle, and over 16 cycles that gives 144 bytes of data (128 bytes of write data and 16 bytes of ECC data).

Mask array 1 110, write buffer 1 114, command generation module 118, ECC generation module 132, and MUX 1 136 are mirror images of the components described above, and operate in the same fashion. Many of these details are implementation specific and are only used to describe one embodiment of the present invention.

By adding the mask value to the write data and the write mask command, the XDR memory system can write the proper data to the XDR DRAMs. The mask value in the command informs the DRAM of the value of the mask byte and that it should mask bytes with this value. From FIG. 1, there is only one instance of mask generation logic 106. This logic 106 generates the mask values for both XIOs. The write command from the memory controller indicates which XDR DRAM the data is written to. Furthermore, the mask generation is done as the data is received, which eliminates the need for a two-port array. The two-port array is replaced by a mask array 108 or 110 and a single port write buffer 112 or 114, respectively.

Referring to FIG. 2, reference numeral 106 generally designates a block diagram illustrating an apparatus that accomplishes the mask value generation in the write mask operation. The mask generation operation 106 has two components. First, tally module 202 receives the write data packet, which is 18 bytes per cycle, and keeps track of (tallies) the byte values in the incoming data. Tally module 202 transmits to the find first zero module 204 output signals that indicate if a particular data byte value was found or not ("1" if found, "0" if not found). In turn, if the find first zero module 204 finds a "0" in these tally outputs, which indicates that this byte value represented by the "0" is not present in the write data packet, it encodes that byte value into an 8-bit mask value.

For write operations, since each byte is 8 bits, it follows that the tally module 202 should keep track of the byte values for the entire 256 possible byte values. For this embodiment, however, to save area on the chip, tally module 202 only looks for a specific set of values within the incoming byte values. In this example, tally 202 compares a maximum of 144 (18 bytes times 8 beats) possible byte values with incoming byte values to find a match per byte. The tally 202 has a single output bit for each of the 144 byte values it is looking for. The input is 18 bytes per cycle, so tally 202 has 18 individual 8 to 144 decoders (which 144 of the 256 possible byte values are decoded and tracked is completely arbitrary and selected to limit the logic required). Each of those 144 outputs goes to 144 cells (not shown within tally 202). Each cell then receives 18 inputs (one for each input byte), and if any one of those inputs is on, it sets the output. At the end of 8 cycles of data (cacheline), the tally 202 outputs are valid to indicate whether the cacheline contained that byte ("1") or the cacheline did not contain that byte ("0"). There is a reset signal to reset all of the tallies between each cacheline.

Tally 202 transmits its outputs to the find first zero module 204. This module 204 finds the first zero (or alternatively any zero) from the tally outputs. It uses the tally outputs to choose a mask value. If all of the tally outputs are "1," the module 204 does not see a first zero so it outputs a default byte value that is not used in the tally decoder. This default byte value is implemented such that it is impossible for this byte value to exist within the incoming write data packet. If there is a zero in the tally output, the find first zero module 204 selects the first zero it finds and encodes it into byte value associated with the zero. This indicates that the associated byte value, which is now the mask value, is not found within the incoming data packet. Module 204 transmits this mask value to mask array 0 108 or mask array 1 110. Many of these details are implementation specific, and are only described in detail to provide a better understanding of the present invention.

Figure 3:
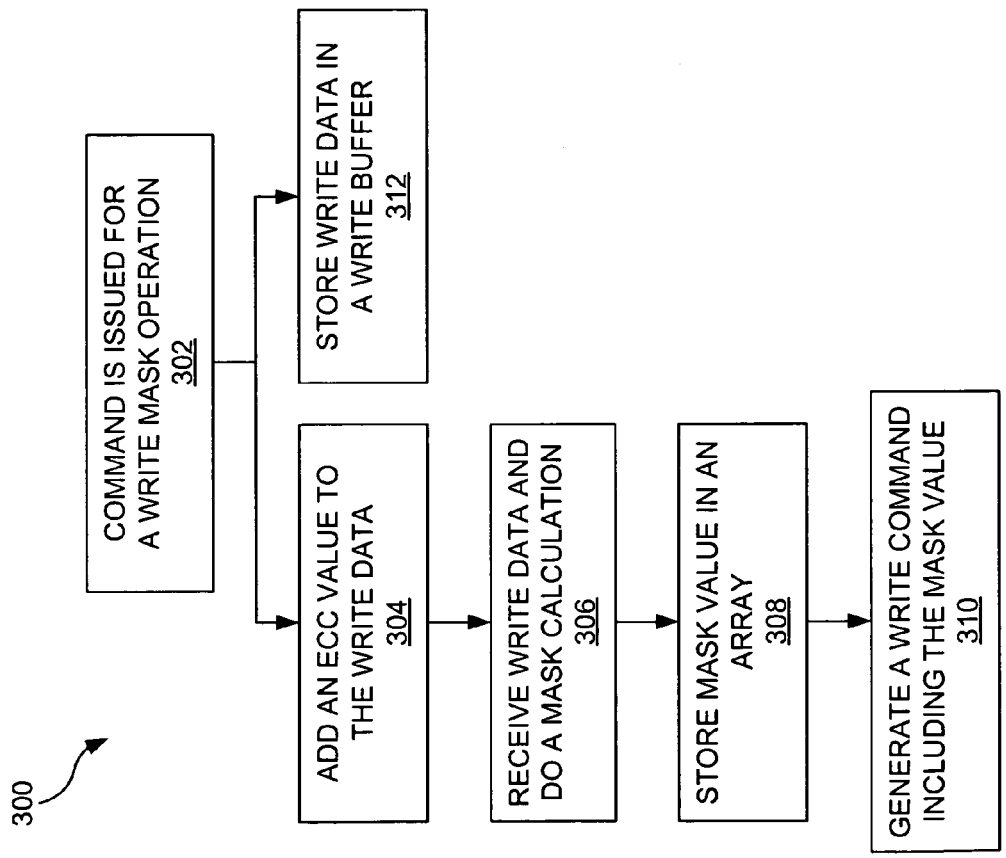
FIG. 3 is a flow chart illustrating the process for the calculation and storage of a mask value for the write mask operation.

Referring to FIG. 3, the reference numeral 300 generally designates a flow chart illustrating the process for the calculation and storage of a mask value for the write mask operation. First, the memory controller issues a command for a write mask operation 302. Then, the ECC generation module generates an ECC value and adds it to the write data packet 304. Independently, the memory controller controls the storage of the write data in a write buffer 312. The mask generation module calculates a mask value for the write data packet 306. The memory controller controls the storage of this mask value in an array 308. Lastly, the command generation module generates a write command that incorporates the mask value 310.

Figure 4:
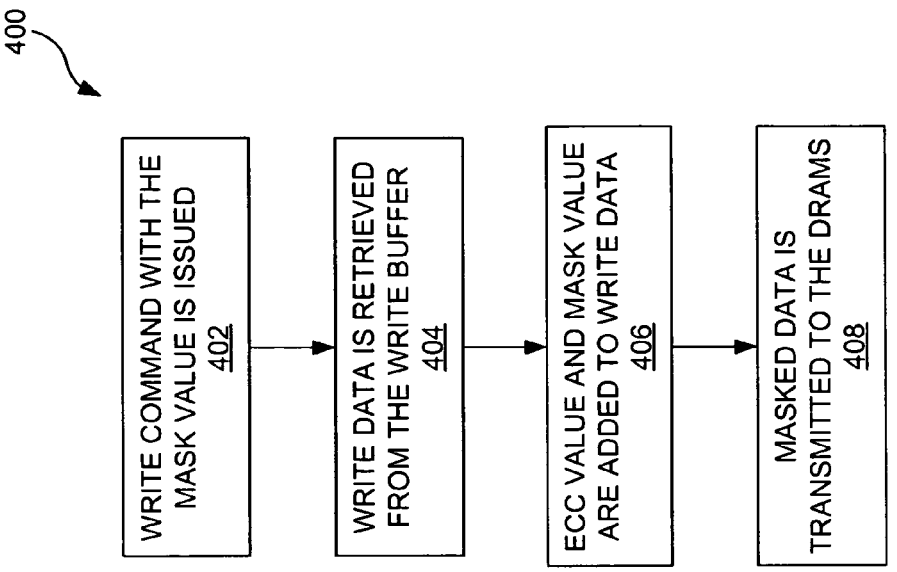
FIG. 4 is a flow chart illustrating the process for the transmission of the masked write data for the write mask operation.

Referring to FIG. 4 of the drawings, reference numeral 400 generally designates a flow chart illustrating the process for the transmission of the masked write data for the write mask operation. After the mask generation module produces the mask value and the command generation module generates a write mask command incorporating that mask value 300, the memory controller controls the transmission of the masked write data to the XDR DRAMs 400. First, the memory controller issues the write command with the mask value 402. Then, the memory controller directs the write buffer to transmit the write data 404. The memory controller issues commands to add an ECC value and a mask value to the write data 406. Finally, the memory controller controls the transmission of the masked data to the DRAMs 408. This is the procedure by which a write that is smaller than a full cacheline is accomplished by using a write mask operation in an XDR memory system.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for handling write mask operations in an Extreme Data Rate (XDR) Dynamic Random Access Memory (DRAM) memory system containing a plurality of buffers and a plurality of XDR DRAMs, comprising:
   storing a data packet in at least one of a plurality of write buffers;
   independently performing a mask calculation on the data packet to determine a mask value;
   storing the mask value in at least one of a plurality of mask buffers;
   generating a mask write command utilizing the mask value;
   masking the data packet in response to the mask write command; and
   storing only a portion of the data packet that is not masked in at least one of the plurality of XDR DRAMs.

2. The method of claim 1, wherein the performing step further comprises calculating an error correction code (ECC) for the data packet to determine an ECC value prior to performing a mask calculation, and adding the ECC value to the data packet.

3. The method of claim 2, wherein the performing step further comprises finding a mask value that is not contained in the data packet or in the ECC value.

4. The method of claim 3, wherein the step of finding a mask value further comprises, decoding a number of byte values that is equivalent to the byte length of the data packet.

5. The method of claim 1, wherein the masking step further comprises performing an ECC calculation on the data packet to determine an FCC value prior to masking the data packet, and adding the ECC value to the data packet.

6. The method of claim 5, wherein the masking step further comprises generating a masked data packet by masking portions of the data packet that are equivalent to the mask value.

7. An apparatus for handling write mask operation in an XDR DRAM memory system, comprising:
   at least one write buffer that is at least configured to store a data packet;
   at least one mask generation module that is at least configured to generate a mask value for the data packet;
   at least one mask array that is at least configured to store the mask value and interface the at Least one mask generation module;
   at least one multiplexer that is at least configured to:
      receive inputs of the data packet from the at least one write buffer and the mask value from the at least one mask array; and
      output a masked data packet; and
   at least one XDR DRAM that is at least configured to store the masked data packet.

8. The apparatus of claim 7, wherein the apparatus further comprises at least one command generation module that is at least configured to generate a write mask command utilizing the mask value, and to interface the at least one mask array.

9. The apparatus of claim 8, wherein the at least one multiplexer is at least configured to output a masked data packet in response to the write mask command.

10. The apparatus of claim 7, wherein the apparatus further comprises at least one ECC generation module that is at least configured to perform an ECC calculation on the data packet, to add the FCC value to the data packet, and to interface that at least one mask generation module.

11. The apparatus of claim 10, wherein the at least one mask generation module is at least configured to generate a mask value that is not contained in the data packet with the ECC value.

12. The apparatus of claim 11, wherein the at least one mask generation module is at least configured to decode the number of byte values that is equivalent to the length of the data packet to find the mask value.

13. The apparatus of claim 7, wherein the apparatus further comprises at least one ECC generation module that is at least configured to perform and ECC calculation on the data packet, to add the ECC value to the data packet, and to interface the at least one write buffer.

14. The apparatus of claim 7, wherein the at least one multiplexer is at least configured to mask portions of the data packet that are equivalent to the mask value.

15. A computer program product, on a computer readable medium having computer code executable by a computing device, for handling write mask operations in an XDR DRAM memory system containing a plurality of buffers and a plurality of XDR DRAMs, the computer program product comprising:
   computer code for storing a data packet in at least one of a plurality of write buffers;
   computer code for independently performing a mask calculation on the data packet to determine a mask value;
   computer code for storing the mask value in at least one of a plurality of mask buffers;
   computer code for generating a mask write command utilizing the mask value;
   computer code for masking the data packet in response to the mask write command; and
   computer code for storing the masked data packet in at least one of the plurality of XDR DRAMs.

16. The computer program product of claim 15, wherein the computer code for performing a mask calculation on the data packet further comprises performing an FCC calculation on the data packet to determine an FCC value prior to performing a mask calculation, and adding the FCC value to the data packet.

17. The computer program product of claim 16, wherein the computer code for performing a mask calculation further comprises finding a mask value that is not contained in the data packet or in the ECC value.

18. The computer program product of claim 17, wherein the computer code for finding a mask value further comprises decoding the number of byte values that is equivalent to the length of the data packet.

19. The computer program product of claim 15, wherein the computer code for masking the data packet in response to the mask write command further comprises performing an ECC calculation on the data packet to determine an ECC value prior to masking the data packet and adding the ECC value to the data packet.

20. The computer program product of claim 19, wherein the computer code for masking the data packet in response to the write mask command further comprises generating a masked data packet by masking portions of the data packet that are equivalent to the mask value.

* * * * *